US010693450B2

(12) United States Patent
Nedalgi et al.

(10) Patent No.: US 10,693,450 B2
(45) Date of Patent: Jun. 23, 2020

(54) APPARATUS AND METHOD FOR OVER-VOLTAGE PROTECTION

(71) Applicant: Intel IP Corporation, Santa Clara, CA (US)

(72) Inventors: Dharmaray Nedalgi, Bangalore (IN); Karthik Ns, Bangalore (IN); Vani Deshpande, Bangalore (IN); Leonhard Heiss, Warngau (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/022,555

(22) Filed: Jun. 28, 2018

(65) Prior Publication Data
US 2020/0007120 A1    Jan. 2, 2020

(51) Int. Cl.
| H03K 7/08 | (2006.01) |
| H03K 17/082 | (2006.01) |
| H01L 27/02 | (2006.01) |
| H01L 27/088 | (2006.01) |

(52) U.S. Cl.
CPC ..... *H03K 17/0822* (2013.01); *H01L 27/0266* (2013.01); *H01L 27/0886* (2013.01)

(58) Field of Classification Search
CPC ............. H03K 3/02337; H03K 5/2472; H03K 5/2481; H03K 17/08; H03K 17/082; H03K 17/0822; H03K 17/08122; H03K 17/6872; H03F 2200/186; H03F 2200/135; H03F 3/16
See application file for complete search history.

(56) References Cited

U.S. PATENT DOCUMENTS

| 5,736,869 | A | * | 4/1998 | Wei .................. H03K 19/00315 |
| | | | | 326/81 |
| 6,278,287 | B1 | * | 8/2001 | Baze .................. G11C 11/4125 |
| | | | | 257/369 |
| 7,239,177 | B2 | * | 7/2007 | Bansal ............. H03K 19/00315 |
| | | | | 326/56 |
| 2002/0109950 | A1 | | 8/2002 | Marr |
| 2005/0275432 | A1 | | 12/2005 | Bansal |
| 2007/0063758 | A1 | * | 3/2007 | Allard .................. H03K 17/102 |
| | | | | 327/333 |
| 2015/0214723 | A1 | | 7/2015 | Aw |
| 2016/0155737 | A1 | | 6/2016 | Linewih et al. |

FOREIGN PATENT DOCUMENTS

KR    1020180033879    4/2018

OTHER PUBLICATIONS

International Search Report & Written Opinion dated Sep. 20, 2019 for PCT Patent Application No. PCT/US2019/034455.

* cited by examiner

*Primary Examiner* — Hai L Nguyen
(74) *Attorney, Agent, or Firm* — Green, Howard & Mughal LLP

(57) ABSTRACT

An apparatus is provided which comprises: a dual stack voltage driver, wherein the dual stack voltage driver comprises a first stack of transistors, and a second stack of transistors; and one or more feedback transistors each coupled to a transistor of the second stack of transistors.

21 Claims, 12 Drawing Sheets

APPARATUS AND METHOD FOR OVER-VOLTAGE PROTECTION

BACKGROUND

Transistor aging can be a major showstopper in FinFET (Fin Field Effect Transistor) technologies which generally suffer from enhanced degradation of transistors compared to planar technologies. Circuits are generally affected by aging in two ways: (1) continuous decline of the circuit performance over it's lifetime; and (2) an irreversible dielectric breakdown of transistors, leading to an instantaneous failure of the corresponding circuit.

Due to the exponential voltage dependence of aging, aging mainly affects circuits where transistors are exposed to over-voltages. One class of circuits where over-voltages commonly appear are high voltage circuits using stacked low voltage devices. Examples of high voltage circuits are high-voltage I/O cells, power amplifiers, or DC-DC converters, etc.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
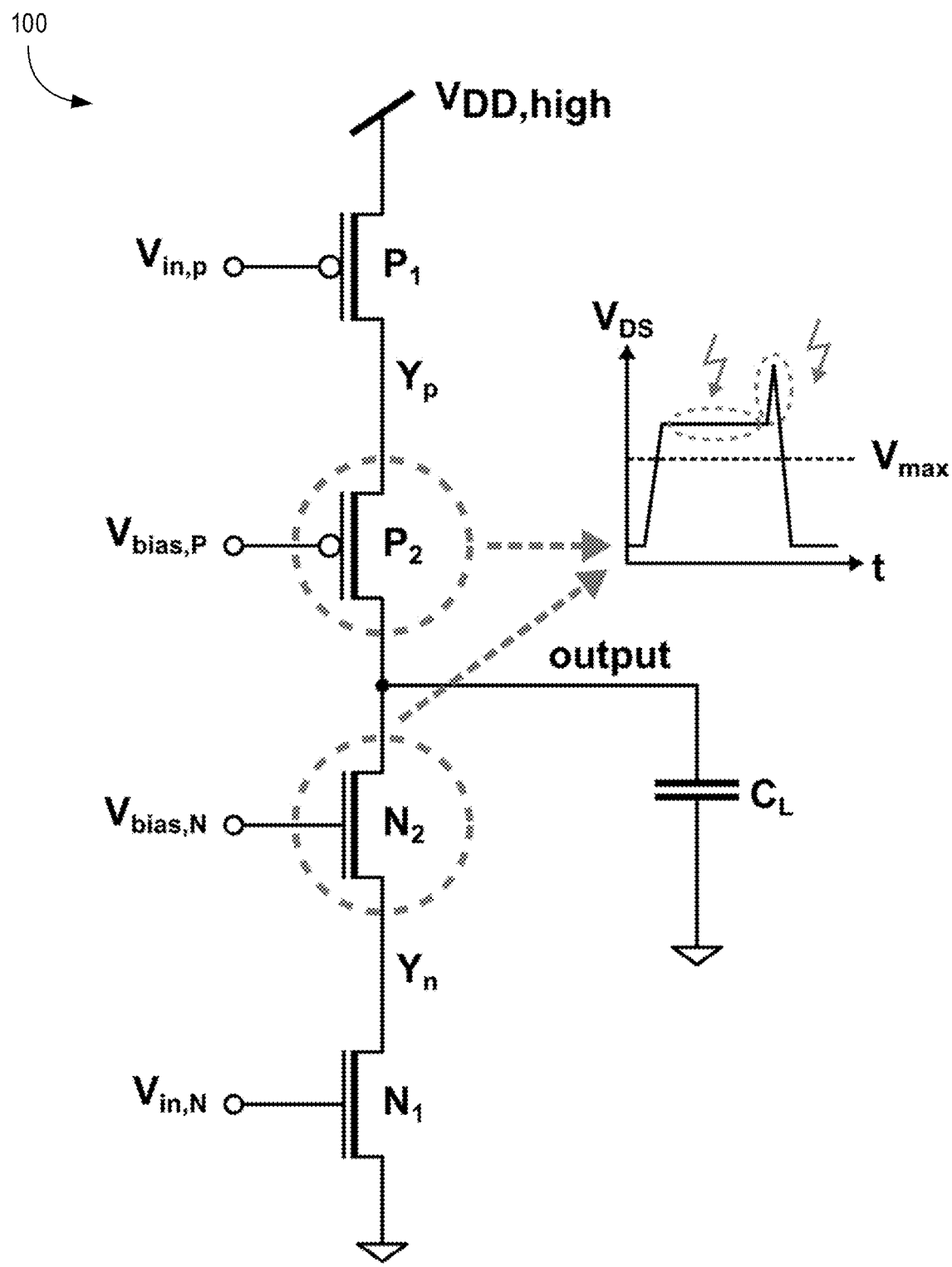
FIG. 1 illustrates a schematic of a dual stack high voltage driver stage according to some embodiments.

Due to the intrinsic process robustness of planar technologies, countermeasures at circuit level to prevent and limit maximum operating limits were not so critical in the past. As process geometry for FinFET technology shrinks to 14 nm or 10 nm or 7 nm, device geometry is more susceptible to aging. Even moderate over-voltages on nodes of the circuits lead to a failure for standard circuit topologies. Similar problems also exist for small geometry processes in SOI (Silicon-on-insulator) technologies.

One solution to overcome aging is to reduce the supply voltage to give more headroom for operating voltages. However, reducing supply voltage circuits operation and limits circuit driving capability, thereby leading to severe timing violations across chips.

Some embodiments of the current invention present a new methodology to prevent static and dynamic over-voltages in stacked high voltage circuit topologies. One benefit of the solution of some embodiments is that it keeps the design, area and power overhead at a minimum. The embodiments are used to design robust high voltage circuits which fulfill automotive/industrial customer requirements in highly scaled technologies which are usually increasingly prone to reliability issues. For example, some embodiments are applied to a high voltage I/O circuit design to achieve a target lifetime of 10 years with 100% activity. Such aging mitigation is not possible with existing design solutions.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part of and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The term "device" may generally refer to an apparatus according to the context of the usage of that term. For example, a device may refer to a stack of layers or structures, a single structure or layer, a connection of various structures having active and/or passive elements, etc. Generally a device is a three dimensional structure with a plane along the x-y direction and a height along the z direction of an x-y-z Cartesian coordinate system. The plane of the device may also be the plane of an apparatus which comprises the device.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies.

The terms "left," "right," "front," "back," "top," and "bottom" and the like in the description and in the claims, if any, are used for descriptive purposes and not necessarily for describing permanent relative positions.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "between" may be employed in the context of the z-axis, x-axis or y-axis of a device. A material that is between two other materials may be in contact with one or both of those materials, or it may be separated from both of the other two materials by one or more intervening materials. A material that is between two other materials may be in contact with one or both of those materials, or it may be separated from both of the other two materials by one or more intervening materials, either temporally, spatially, in ranking or connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 illustrates a schematic (100) of a dual stack high voltage circuit (supply voltage $V_{DD,high}$), comprising two input signal transistor $N_1$ and $P_1$ and two cascode transistors $N_2$ and $P_2$. It is assumed that the transistor junction voltages for any of the transistors may not exceed a maximum voltage level Vmax to avoid excessive degradation of the device. For example, Vmax=C×$V_{DD,low}$, where $V_{DD,low}$ is the nominal supply voltage of the corresponding transistor type and the constant factor C which is typically in the range 1.05-1.1.

The marked cascode transistors of a stacked circuit topology ($N_2$, $P_2$) are often subjected to over-voltages where the drain source voltage $V_{DS}$ of the cascode transistor exceeds Vmax. The cascode transistors can be damaged by two types of over-voltages, for example: (1) static over-voltages and (2) dynamic over-voltages (e.g., transient spikes) as shown by the inset in FIG. 1. Both types of over-voltages may lead to excessive transistor and circuit degradation and may trigger transistor breakdown events (e.g., immediate failure of corresponding circuit).

Static over-voltages appear on nodes if the signal transistor ($N_1$ or $P_1$) are turned off and the entire voltage drop across an nFET or pFET stack is equal to $V_{DD,high}$, e.g. $V_{DD,high}$=2×$V_{DD,low}$. Usually the voltage drop across the stack is slightly asymmetric so that VDS of the cascode transistors ($N_2$ or $P_2$) can exceed Vmax.

Dynamic overshoots (e.g., transient peaks) appear if the signal transistors turn from the off state to the on state to discharge (through the nFET stack) or charge (through the pFET stack) the output node. Since the capacitive load CL at the circuit output is usually significantly larger than the capacitance at the intermediate nodes ($Y_n$, $Y_p$) of a transistor stack, the intermediate nodes are discharged (through the nFET stack)/charged (through the pFET stack) at a higher rate than output node. In other words, the voltage or charge on the source of the cascode transistors are discharged/charged at a higher rate than the corresponding drain, resulting in a transient overshoot of the drain source voltage $V_{DS}$ for the duration of the discharging/charging of the output.

Figure 2A:
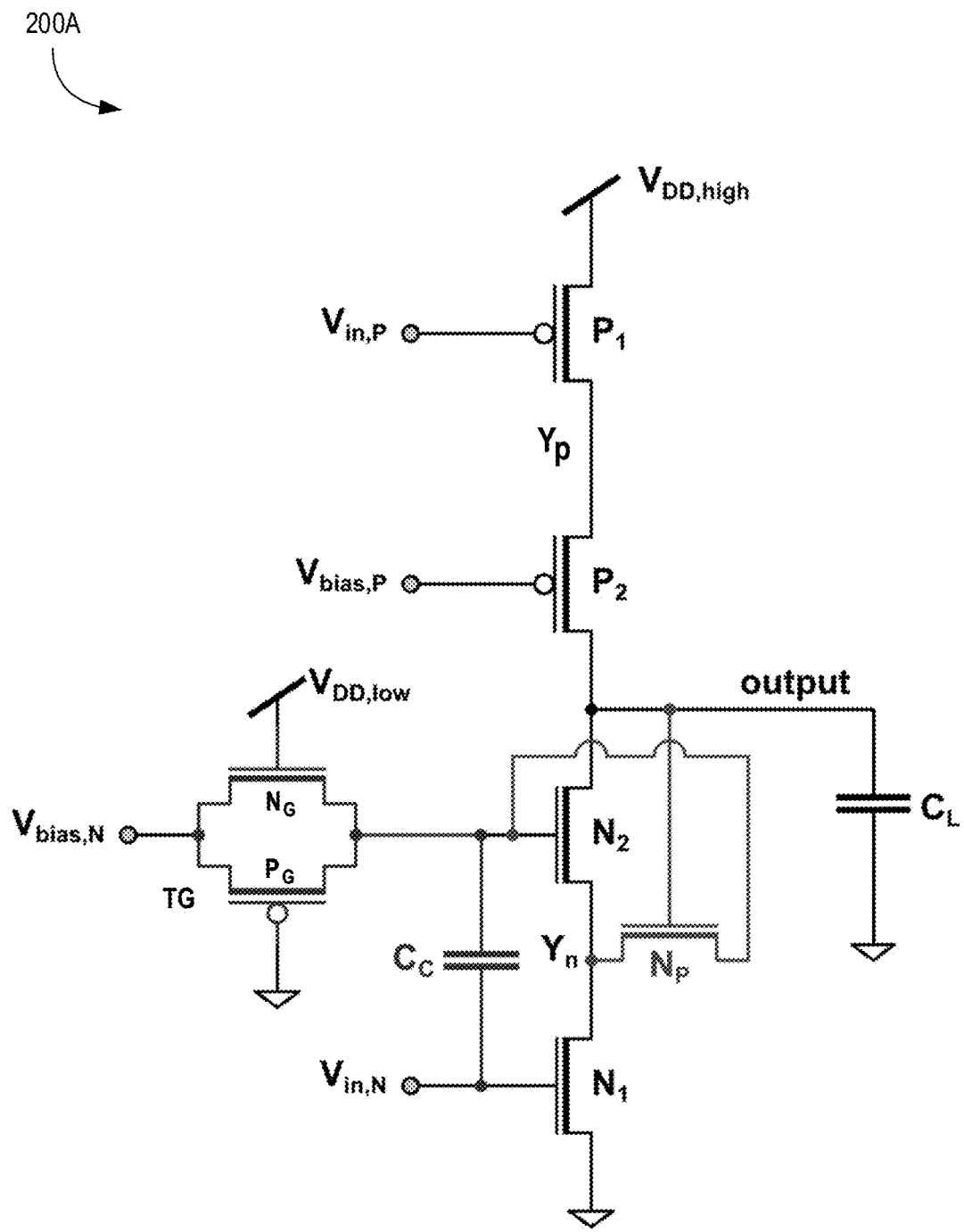
FIGS. 2A-2C illustrate schematics of over-voltage protection circuitries (OPC), respectively, to prevent static and dynamic over-voltages, according to some embodiments.

FIG. 2A illustrates a schematic (200A) of an over-voltage protection circuitry (OPC) to prevent static and dynamic over-voltages, according to some embodiments of current invention. In some embodiments, the over-voltage protection circuitry (OPC) is coupled to a dual stack high voltage circuit (e.g., supply voltage $V_{DD,high}$), comprising two input signal transistors $N_1$ and $P_1$ and two cascode transistors $N_2$ and $P_2$. In some embodiments, the over-voltage protection circuitry (OPC) comprises of two sub-circuitries which in combination grant reliable operation of the circuit stack. The two sub-circuitries are: an additional protection transistor $N_P$ to avoid static over-voltages; and an additional coupling capacitor $C_C$ to avoid dynamic over-voltages. In some embodiments, transistor $N_P$ is connected between the intermediate node $Y_n$ and the DC bias voltage $V_{bias,N}$, where the gate of transistor $N_P$ is connected to the output node. If the signal transistor ($N_1$) is turned off and the output is pulled high, then transistor $N_P$ is turned on and charges node $Y_n$ to a well-defined DC bias voltage $V_{bias,N} \le V_{max}$. By charging the node $Y_n$ to a well-defined DC voltage, the voltage drop across the transistor stack can be made symmetrical, thereby avoiding over-voltages at the cascode transistor $N_2$.

In some embodiments, a capacitive device CC is connected between the gate of the signal transistor (N1) and the gate of the cascode transistor (N2). If the signal transistor is turned on, the capacitive coupling through capacitive device CC increases the gate voltage of the cascode transistor N2. This results in an increased overdrive voltage of transistor N2 which in turn allows transistor N2 to discharge the output node at a faster rate, similar to the discharge rate of the intermediate node $Y_n$. Discharging the drain and source of the cascode transistor N2 at a similar rate finally avoids transient VDS overshoots at the cascode transistor N2. The additional transmission gate is used to isolate the gate of transistor N2 from the low resistance source DC $V_{bias,N}$.

In some embodiments, the capacitive device $C_c$ is implemented as a transistor configured as a capacitor. In some embodiments, capacitive device $C_c$ is implemented as a metal capacitor. In some embodiments, the capacitive device $C_c$ is implemented as an MIM device (metal-insulator-metal device). In some embodiments, the capacitive device $C_c$ is implemented as any combination of transistor, metal, or MIM device(s).

In some embodiments, the dual stack high voltage circuit 200A comprises a first power supply rail to provide a first power supply; for example the supply voltage $V_{DD,high}$ in FIG. 2A. In some embodiments, the dual stack high voltage circuit 200A comprises a second power supply rail to provide a second power supply, wherein the first power supply is higher than the second power supply; for example $V_{DD,low}$ in FIG. 2A. In some embodiments, the dual stack high voltage circuit 200A comprises a first stack of transistors of a same conductivity type, the first stack including a first transistor and a second transistor coupled in series and having a first common node $Y_p$, wherein the first transistor is coupled to the first power supply rail; for example transistors $N_1$ and $N_2$ in FIG. 2A.

In some embodiments, the dual stack high voltage circuit 200A comprises a second stack of transistors of an opposite conductivity type to the first stack of transistors, the second stack including a third transistor and a fourth transistor (for example transistors $N_1$ and $N_2$ in FIG. 2A, respectively, wherein the third transistor is $N_2$) is coupled in series and has a second common node $Y_n$, wherein the second stack of transistor is coupled in series to the first stack of transistors and has a third common node "output", wherein a gate terminal of the third transistor is coupled to a circuitry which is coupled to the second power supply rail (for example $V_{DD,low}$). In some embodiments, the dual stack high voltage circuit 200A comprises a feedback transistor $N_p$ of a same conductivity type of the third transistor coupled to the second common node $Y_n$ and a gate terminal of the third transistor of the second stack; for example transistor $N_p$ in FIG. 2A. In some embodiments, the feedback transistor includes a gate terminal which is coupled to the third common node "output"; for example gate terminal of transistor $N_p$ coupled to the third common node "output" in FIG. 2A. In some embodiments, the gate terminal of the third transistor, and a gate terminal of the fourth transistor are controllable by two separate control nodes; for example gate terminals of transistors $N_1$ and $N_2$.

In some embodiments, the gate terminal of the third transistor is coupled to a second power rail via a pass-gate (e.g., transmission-gate) circuitry. For example, the gate terminal of transistor $N_2$ is coupled to $V_{DD,low}$ via the pass-gate circuitry (e.g., transmission-gate) TG in FIG. 2A. In some embodiments, the pass-gate circuitry TG includes transistors PG and NG. The usage of transmission gates is a specific implementation of a series resistor. In some embodiments, each gate terminal of transistor $N_2$ is coupled to the corresponding bias voltages $V_{bias,N}$ via a series resistor. In some embodiments, a gate terminal of a first transistor $P_1$ is coupled to an input voltage, and a gate terminal of the second transistor $P_2$ is coupled to a bias voltage; for example the gate terminal of transistor $P_1$ is coupled to $V_{in,P}$ and the gate terminal of transistor $P_2$ is coupled to $V_{bias,P}$. In some embodiments, the feedback transistor $N_p$ is smaller in size than the third transistor. For example, transistor $N_p$ is smaller in size than transistor $N_2$. In some embodiments the feedback transistor $N_p$ is an n-type transistor. In some embodiments, the circuitry comprises a capacitor which is coupled with the gate of the third transistor $N_2$ and the gate of the fourth transistor $N_1$, for example capacitor Cc in FIG. 2A. In some embodiments, the size of the capacitor $C_c$ is proportional to a size of the third transistor $N_2$. In some embodiments, the capacitor $C_c$ could be formed by a series of capacitors coupled in series and/or in parallel.

Figure 2B:
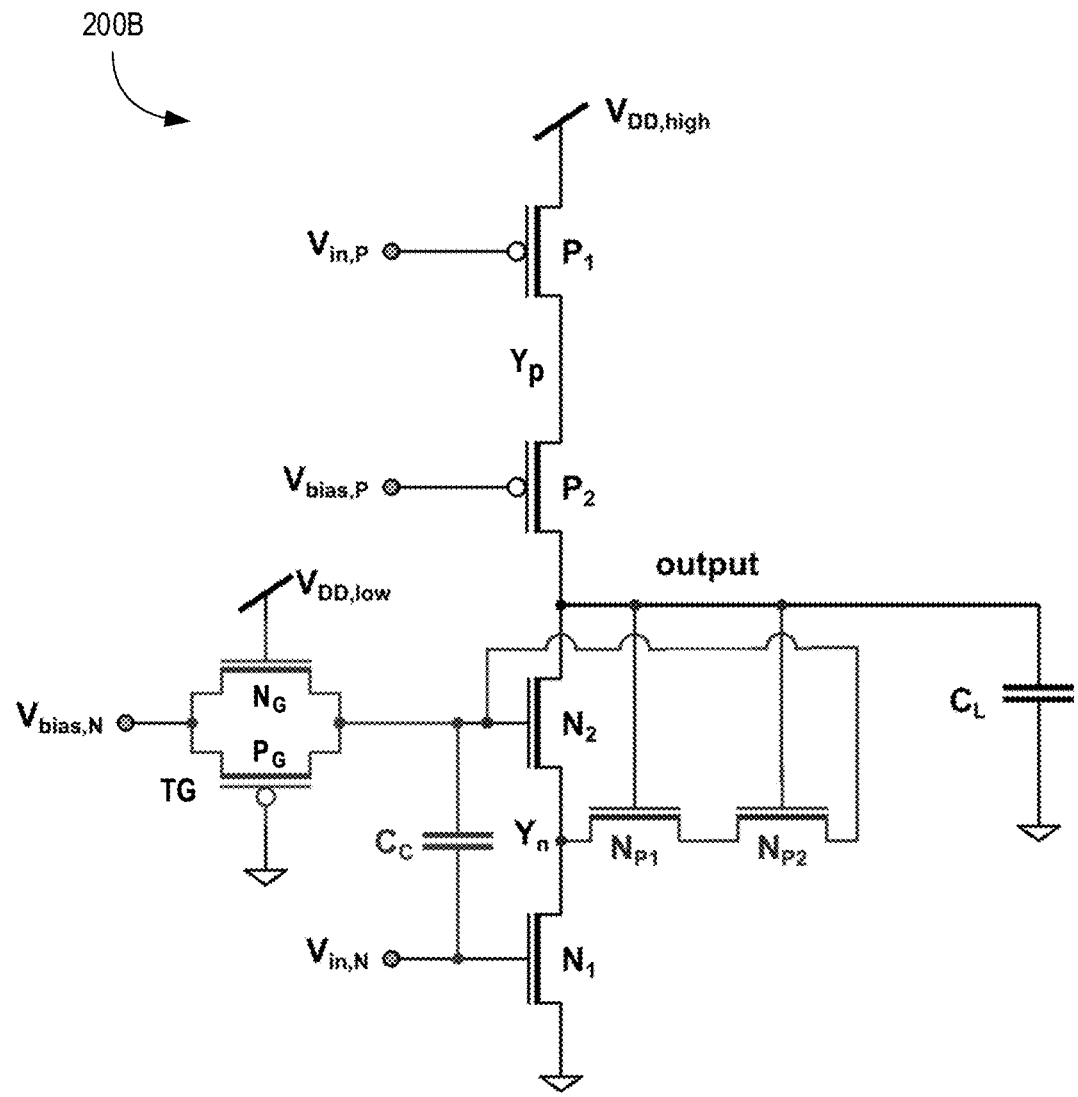

FIG. 2B illustrates a schematic (200B) of an over-voltage protection circuitry (OPC) to prevent static and dynamic over-voltages, according to some embodiments of current invention. The embodiment of FIG. 2B is similar to FIG. 2A, except for the feedback transistors $N_{P1}$ and $N_{P2}$. Similar to the dual stack high voltage circuit 200A, the dual stack high voltage circuit 200B comprises a first power supply rail to provide a first power supply; for example the supply voltage $V_{DD,high}$ in FIG. 2B, and the dual stack high voltage circuit 200B comprises a second power supply rail to provide a second power supply, wherein the first power supply is higher than the second power supply; for example $V_{DD,low}$ in FIG. 2B. Similarly, in some embodiments, the dual stack high voltage circuit 200B comprises a first stack of transistors of a same conductivity type, including a first transistor and a second transistor coupled in series; for example transistors $N_1$ and $N_2$ in FIG. 2B.

In some embodiments the dual stack high voltage circuit comprises a second stack of transistors of an opposite conductivity type to the first stack of transistors, the second stack including a third transistor and a fourth transistor (for example transistors $N_1$ and $N_2$ in FIG. 2B. In some embodiments the dual stack high voltage circuit comprises one or more feedback transistors coupled in series and of the same conductivity type of the third transistor coupled to a second common node $Y_n$ and a gate terminal of the third transistor of the second stack; for example transistor $N_{P1}$ and $N_{P2}$ in FIG. 2B. In some embodiments, the feedback transistors include a gate terminal which are coupled to a third common node "output"; for example gate terminal of transistor $N_{P1}$ and $N_{P2}$ are coupled to the third common node "output" in FIG. 2B. In some embodiments, the gate terminal of the third transistor, and a gate terminal of the fourth transistor are controllable by two separate control nodes; for example gate terminals of transistor $N_2$ and transistor $N_1$.

In some embodiments, the feedback transistors are smaller in size than the third transistor. For example, transistors $N_{P1}$ and $N_{P2}$ are smaller in size than transistor $N_2$. In some embodiments the feedback transistors (for example $N_{P1}$ and $N_{P2}$) are an n-type transistor. In some embodiments, the circuitry comprises a capacitor which is coupled with the gate of the third transistor and the gate of the fourth transistor, for example capacitor $C_c$ in FIG. 2B. In some embodiments, the size of the capacitor is proportional to a size of the third transistor, for example the size of the capacitor Cc is proportional to the size of transistor $N_2$ in FIG. 2B. In some embodiments the capacitor Cc could be formed by a series of capacitors coupled in series and/or in parallel.

Figure 2C:
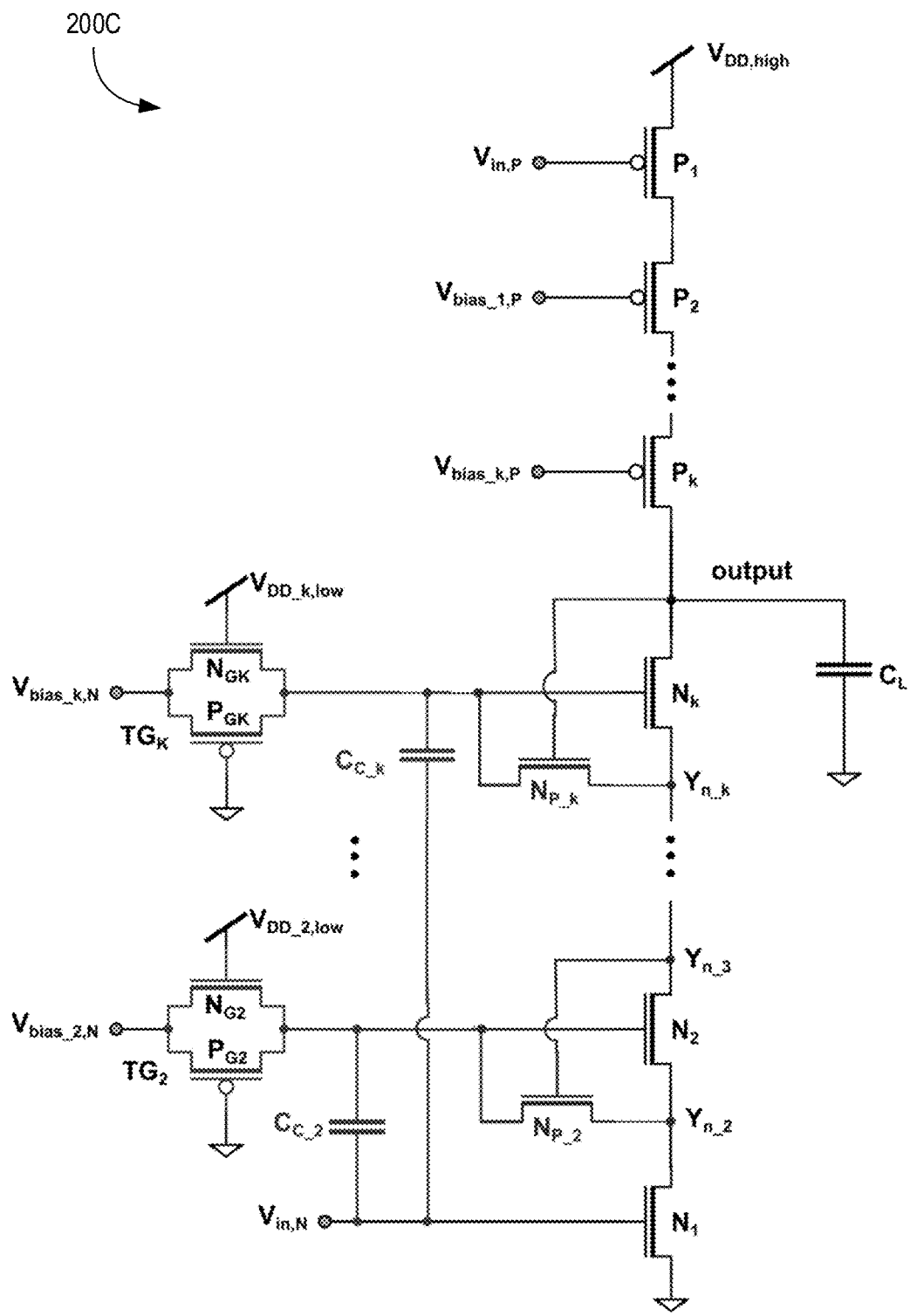

FIG. 2C illustrates a schematic (200C) of an over-voltage protection circuitry (OPC) to prevent static and dynamic over-voltages, according to some embodiments of the current invention. In some embodiments, the dual stack high voltage circuit 200C comprises a dual stack high voltage driver, wherein the dual stack voltage driver comprises a first stack of transistors, and a second stack of transistors. In some embodiments, the number of transistors in each stack is "k" which is an integer equal to or larger than 2. For example the first stack comprises of transistors $P_1$, $P_2$ to $P_k$, and the second stack comprises of transistors $N_1$, $N_2$ to $N_k$.

In some embodiments, the dual stack high voltage circuit 200C comprises one or more feedback transistors each coupled to a transistor of the second stack of transistors. For example, the transistor $N_{p\_k}$ is coupled to transistor $N_k$, and transistor $N_{P\_2}$ is coupled to transistor $N_2$. In some embodiments, the number of transistors in the second stack is more than two, and one or more feedback transistors is each coupled to a transistor in the second stack. In some embodiments, the first stack of transistors, and the second stack of transistors are coupled at a common node, shown for example as node "output" in FIG. 2C.

In some embodiments, each second stack transistor and its adjacent second stack transistor are coupled at a first common node, and wherein the feedback transistor coupled to the second stack transistor includes a gate terminal which is coupled to the first common node. For example the gate terminal of feedback transistor $N_{p\_k}$ is coupled to the common node "output" between the two stacks, and the gate terminal of feedback transistor $N_{p\_2}$ is coupled to a first common node $Y_{n\_3}$ in FIG. 2C. In some embodiments, each feedback transistor is coupled to the gate of a second stack transistor, and is coupled to a second common node of the second stack transistor. For example, feedback transistor $N_{p\_k}$ is coupled to common node $Y_{n\_k}$ and the gate of second stack transistor $N_k$, and the gate terminal of feedback transistor $N_{p\_2}$ is coupled to a second common node $Y_{n\_2}$ in FIG. 2C. In some embodiments, each of the gate terminals of the transistors of the second stack of transistors are controlled by a separate control node. In some embodiments, one or more of the gate terminals of the transistors of the second stack of transistors are coupled to a separate power rail via a pass-gate circuitry, for example power rails $V_{DD\_k,low}$ and $V_{DD\_2,low}$, and pass-gate circuitry (i.e. transmission-gate) $TG_k$ and $TG_2$. In some embodiments the pass-gate circuitry $TG_2$ and $TG_k$ include transistors $P_{G2}$, $N_{G2}$ and $P_{Gk}$, $N_{Gk}$ respectively. The usage of transmission gates is a specific implementation of a series resistor. In some embodiments, each gate terminal of a second stack transistor $N_k$ is coupled to the corresponding bias voltages $V_{bias\_k,N}$ via a series resistor.

In some embodiments, each feedback transistor is smaller in size than the second stack transistor to which it is coupled. In some embodiments, the feedback transistors are an n-type transistor. In some embodiments, the dual stack high voltage driver includes one or more capacitors, wherein each capacitor is coupled with the gate of a second stack transistor, and the gate of the signal transistor $N_1$, for example capacitor $C_{c\_k}$, is coupled with the gate of transistor $N_k$ and the gate of transistor $N_1$ in FIG. 2C. In some embodiments, the size of capacitor $C_{c\_k}$ is proportional to the size of the second stack transistor to which it is coupled. For example the size of capacitor $C_{c\_k}$ is proportional to the size of transistor $N_k$ in FIG. 2C. In some embodiments the capacitor $C_{c\_k}$ could be formed by a series of capacitors coupled in series and/or in parallel.

Figure 3:
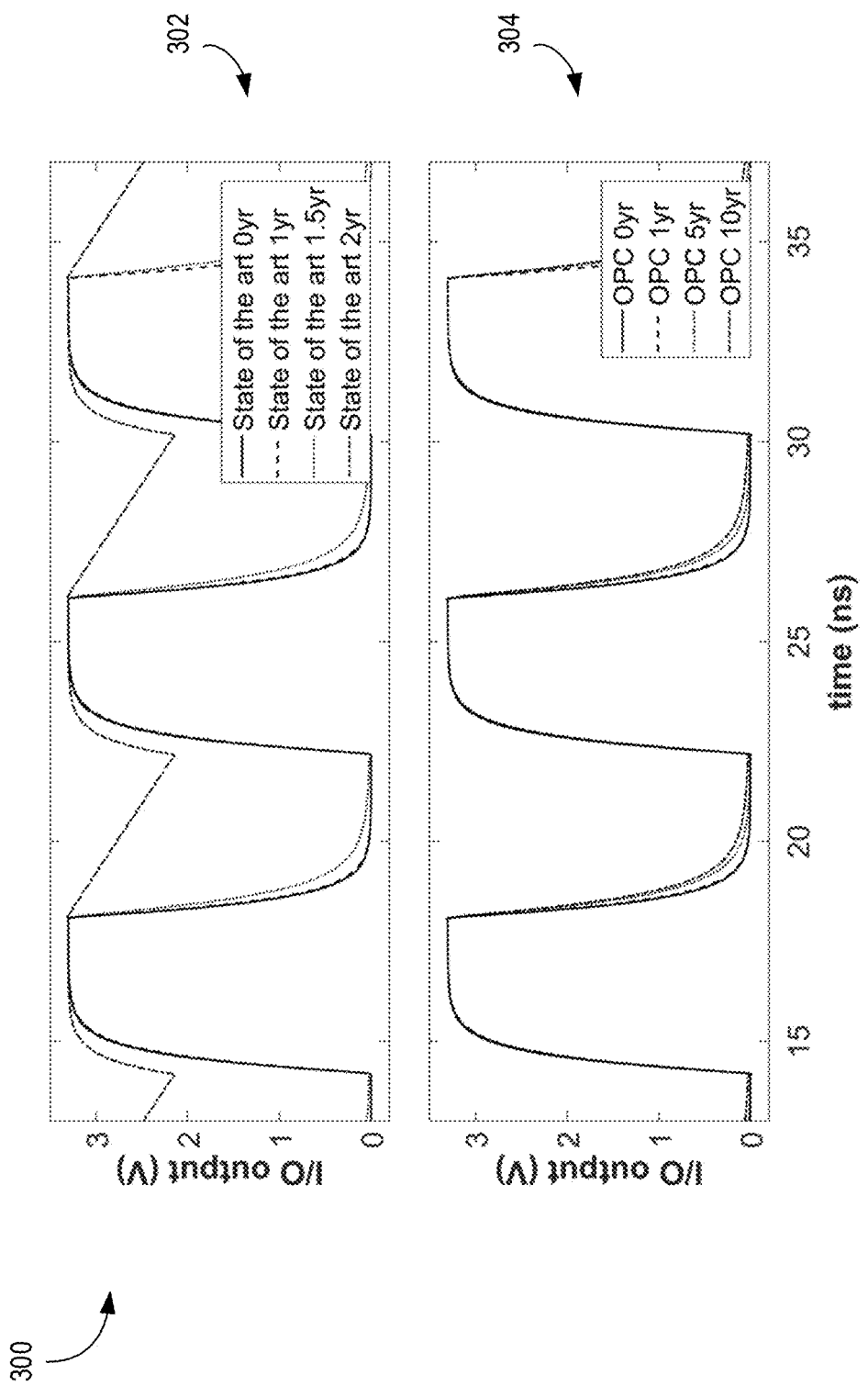
FIG. 3 illustrates a plot showing comparison of the output waveforms of the I/O cell at different times during a product's lifetime, according to some embodiments.

FIG. 3 illustrates plot 300 showing comparison of the output waveforms of the I/O cell at different times during the product lifetime, according to some embodiments. In case of the state of the art (STA) solution, transient overshoots at transistor $N_2$ lead to an extensive aging of the nMOS pull down path and therefore considerably increase the fall time of the output (top plot 302). Already after 2 years—i.e. after only 20% of the target product lifetime—the degradation of the fall time is so high, that the output signal does not reach the VSS level until the end of one clock cycle (top plot 302). In other words, aging leads to a functional failure (circuit malfunction) after a short time. This can be avoided by employing the over-voltage protection embodiments of the current invention. As the waveforms in FIG. 3 (bottom plot 304) show, with over-voltage protection methods according to embodiments of the current invention, the degradation of the output falling edge reduces significantly. Even after 10 years of continuous operation, there is hardly a degradation of the output's falling edge and the circuit is still working correctly (bottom plot 304).

Figure 4:
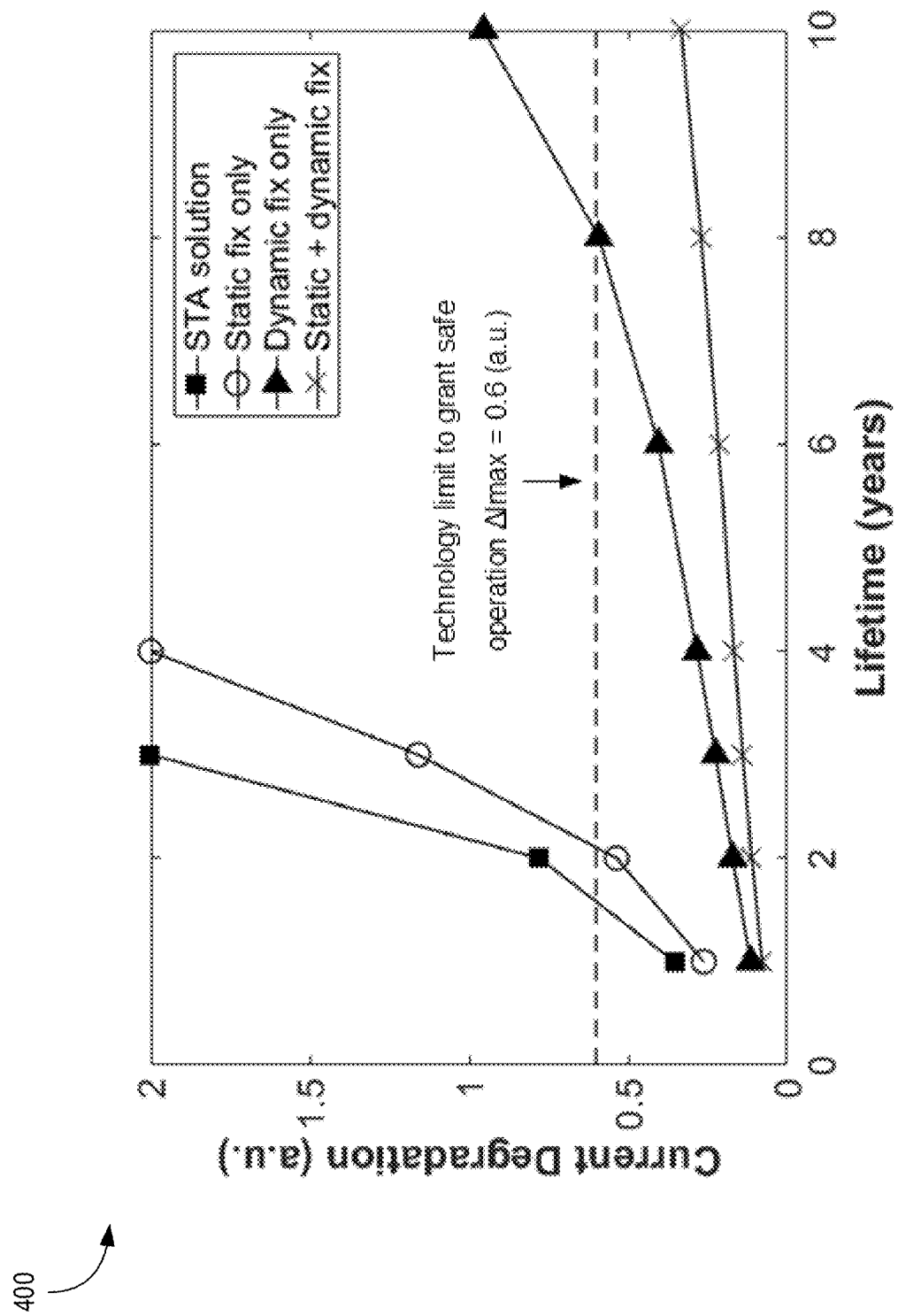
FIG. 4 illustrates a plot showing drive current reduction of a cascode transistor versus lifetime, according to some embodiments.

FIG. 4 illustrates plot 400 showing the drive current reduction of the cascode transistor N2 versus lifetime, according to some embodiments. To prevent irreversible breakdown mechanisms triggered by aging, there is usually an upper limit for the maximum allowed drive current reduction, e.g., 30% as in the shown example. It can be seen that with a state-of-the-art (STA) solution, it would be less than two years. Employing a static over-voltage protection already improves the current degradation and lifetime, but does not solve the entire problem. Using only a dynamic over-voltage protection significantly reduces degradation and allows a lifetime of almost 8 years, while the 10 year lifetime goal is still not met. In some embodiments, if both solutions (static and dynamic) are combined, the goal of a 10 year lifetime can be met. With the combined solution the current degradation after 10 years is merely 16% in this example.

Table 1 summarizes and compares the performance of the state-of-the art solution with the proposed solution.

TABLE 1

| Parameter | State-of-the-art solution | OPC solution |
|---|---|---|
| Circuit Lifetime | <2 years | >10 years |
| Current degradation @ 10 years | 100% | 16% |
| Area impact | 0 | +2.5% |
| Delay | 0 | −5.0% |

Figure 5:
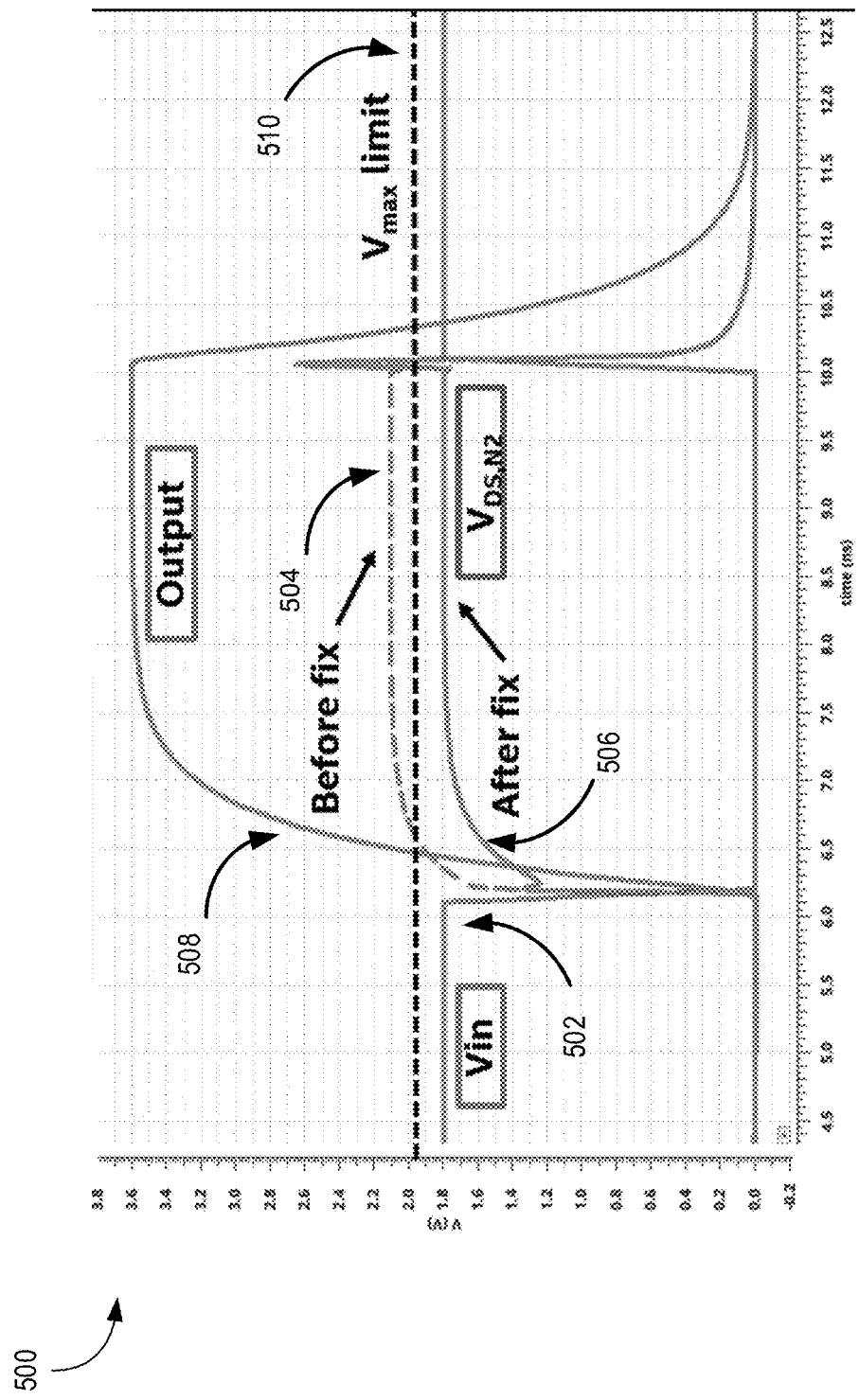
FIG. 5 illustrates a plot showing waveforms of an nFET dual stack with and without static over-voltage protection.

FIG. 5 illustrates plot 500 showing waveforms of nFET dual stack without (504) and with static over-voltage protection (506). If the signal transistor $N_1$ is turned off, the output is pulled high and the voltage drop across the two transistors $N_1$ and $N_2$ is $V_{DD,high}$. Without the over-voltage protection transistor $N_P$, an asymmetric voltage drop across the stack can lead to a static over-voltage across $N_2$ (504), where $V_{DS,N2}>V_{max}$. When this static over-voltage appears, transistor $N_2$ is actually off. In older technologies, the degradation during the off-state was negligible, i.e. transistors could handle higher voltages>$V_{max}$ (510) in the off-state. However, in new (FinFET) technologies the off-state degradation is no longer negligible which requires additional solutions. Inserting the additional protection transistor NP avoids the static over-voltages as FIG. 5 shows (506). With the fix, transistor $N_P$ is turned on whenever the input of the circuit is low (502) and the output is pulled high (508). If transistor $N_P$ is turned on, node $Y_n$ is charged to a well-defined voltage through $N_P$. Charging $Y_n$ to a well-defined voltage results in a symmetric voltage drop across the transistor stack so that $V_{DS,N2}$ (506) does no longer exceed $V_{max}$ (510).

Figure 6:
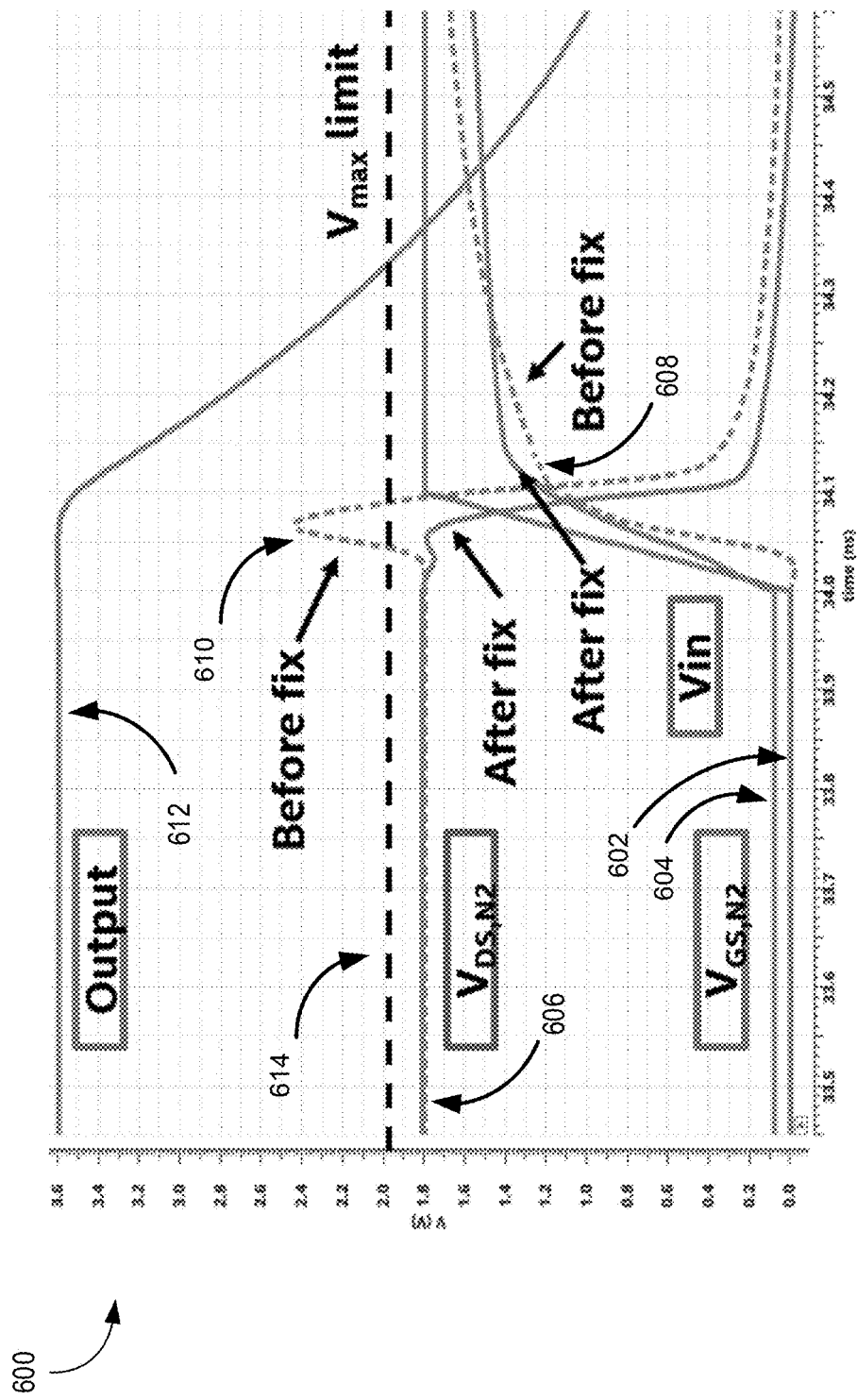
FIG. 6 illustrates a plot showing waveforms in the nFET stack during a high-low transition of the output, according to some embodiments.

FIG. 6 illustrates plot 600 showing the waveforms in the nFET stack during a high-low transition of the output, according to some embodiments. Without a transient over-voltage protection, the drain-source voltage of transistor $N_2$, $V_{DS,N2}$ (610) can exceed the $V_{max}$ limit (614) significantly by a few hundred mV. One root cause for this transient overshoot is the unbalanced discharge rate of the output node and the intermediate note $Y_n$. If the signal transistor $N_1$ is turned on, node $Y_n$ (source of transistor $N_2$) is usually quickly discharged by transistor $N_1$. Contrary to that, the discharging of the output node (drain of transistor $N_2$) is typically much slower due to the large load capacitance which is usually present at the output node. Discharging the source of transistor $N_2$ faster than the drain finally results in the transient overshoot of $V_{DS,N2}$ (610) and undershoot of $V_{GS,N2}$ (608). In some embodiments, the overshoot (610) can be completely removed by transient over-voltage protection circuitry (OPC) comprising the coupling capacitor $C_C$. If the input signal yin (602) switches from high to low, the coupling through coupling capacitor $C_C$ increases the gate voltage of transistor $N_2$, resulting in an increased gate-source voltage $V_{GS,N2}$ (604) as shown by the graphs in FIG. 6. Due to the higher $V_{GS,N2}$, transistor $N_2$ is able to discharge the output node now at a higher rate, similar to the discharge rate of node $Y_n$, thereby avoiding transient peaks of $V_{DS,N2}$ (606).

Figure 7:
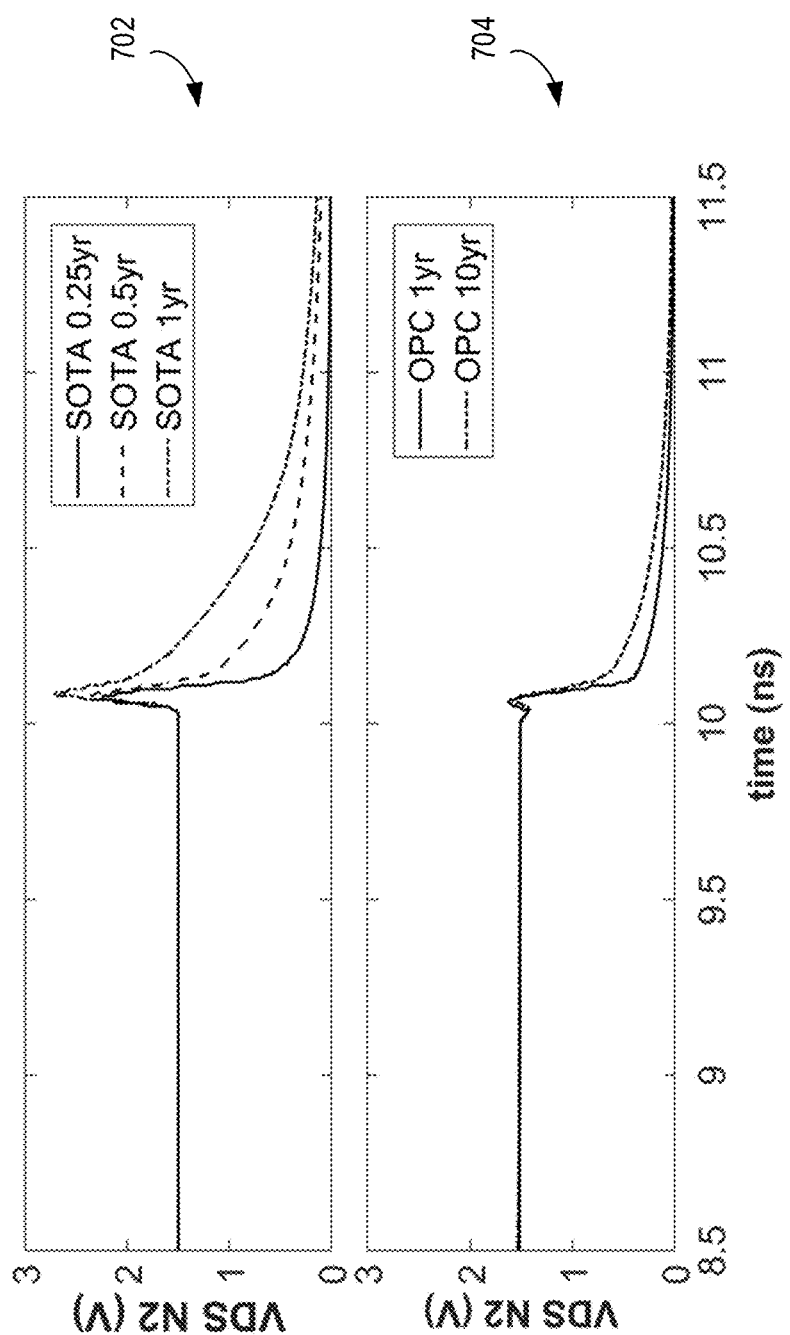
FIG. 7 illustrates a plot showing the effect of positive feedback and its prevention using the over-voltage protection circuitry (OPC), according to some embodiments.
Figure 8:
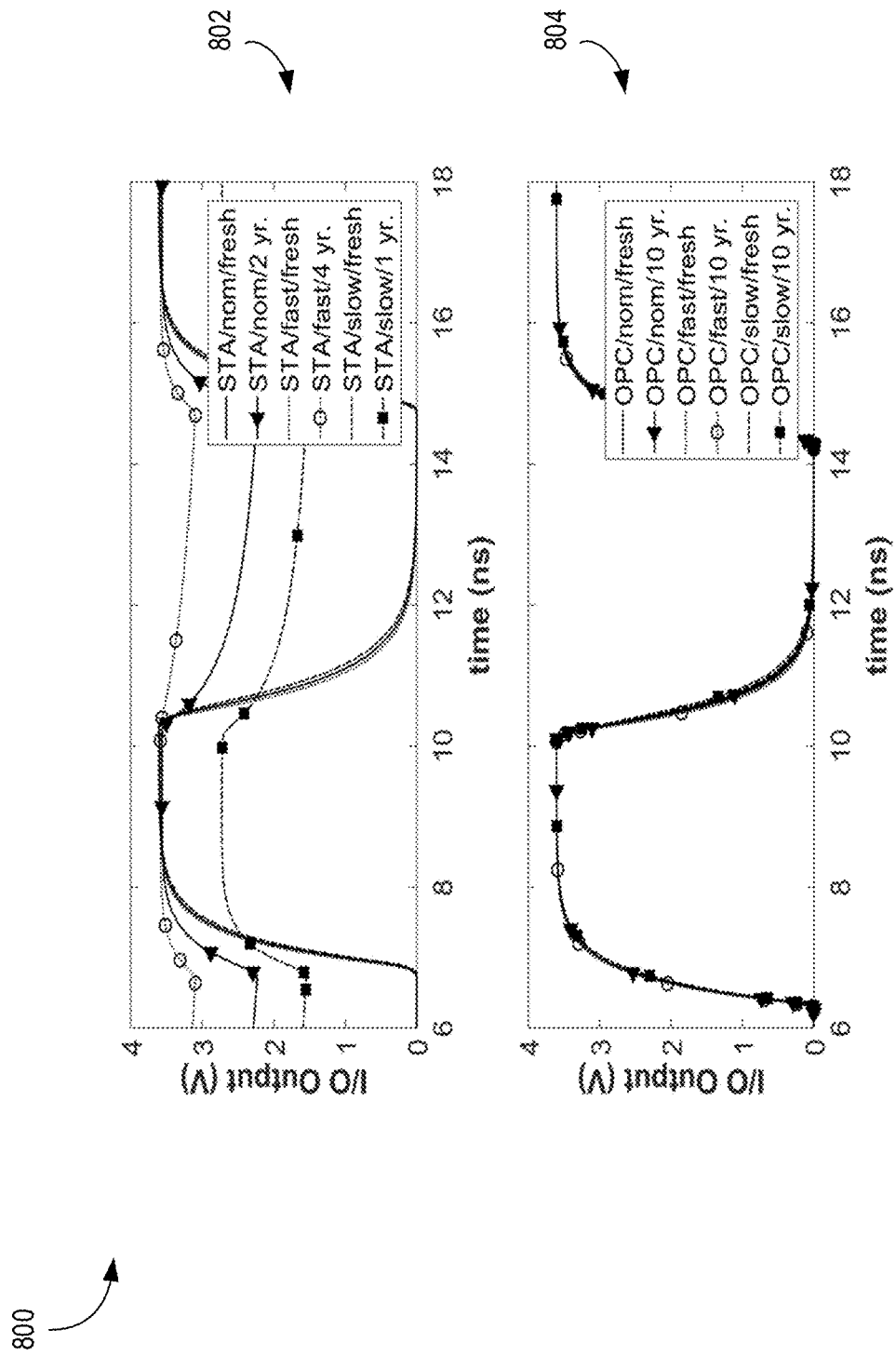
FIG. 8 illustrates the output waveforms of a dual stack I/O cell at different points during the product lifetime for different corners, according to some embodiments.

FIG. 7 illustrates plot 700 showing the effect of positive feedback and its prevention using the over-voltage protection circuitry (OPC) according to some embodiments. One benefit of the embodiments of the current invention's over-voltage protection circuitry is that it prevents the so-called positive feedback aging. The term positive feedback aging describes the effect that due to aging the voltages between transistor junctions steadily increase during operation and therefore accelerates device degradation and circuit malfunctions. Stacked circuit topologies are particularly susceptible to positive feedback aging. The current through a stacked circuit configuration is (to a first order) merely determined by the signal transistor $N_1$, where the voltages at the cascode transistor $N_2$ adjust themselves accordingly. Any kind of over-voltage at transistor $N_2$ results in a degradation of the threshold voltage and conductivity of transistor $N_2$, while the current through $N_2$ (determined by $N_1$) remains almost constant. In order to compensate the degradation of transistor $N_2$, the drain-source voltage $V_{DS,N2}$ now has to increase. However, this increase in $V_{DS,N2}$ further accelerates the degradation of transistor $N_2$ which will in turn cause a further rise of $V_{DS,N2}$. Hence, the over-voltages at $N_2$ will continuously increase during circuit operation, causing a highly accelerated degradation of transistor $N_2$. The first subplot (702) shows the drain-source voltage of the cascode transistor $N_2$ without over-voltage protection at different times. Due to positive feedback aging, the amplitude of the spike increases significantly by a few hundred mV over time which is a major root cause for the ultra-fast failure of the circuits. The second subplot (704) shows the drain-source voltage of $N_2$ employing over-voltage protection schemes according to embodiments of the current invention. The amplitude of $V_{DS,N2}$ remains constant over the entire lifetime, avoiding the positive feedback aging effect.

FIG. 7 illustrates plot 800 showing the output waveforms of a dual stack I/O cell at different points during the product lifetime for different corners, according to some embodiments. The aging impact on the I/O cell has been illustrated at 0, 1, 2, 3, . . . , 10 years. It can be seen that the state of the art (STA) solution does not meet the 10 year lifetime criteria, fails are observed after 2/1/4 years for the nominal/slow/fast corner (subplot 802). With the over-voltage protection circuit (OPC) of some embodiments, the I/O pad is fully functional even after 10 years of continuous operation, across all corners (subplot 804).

Figure 9:
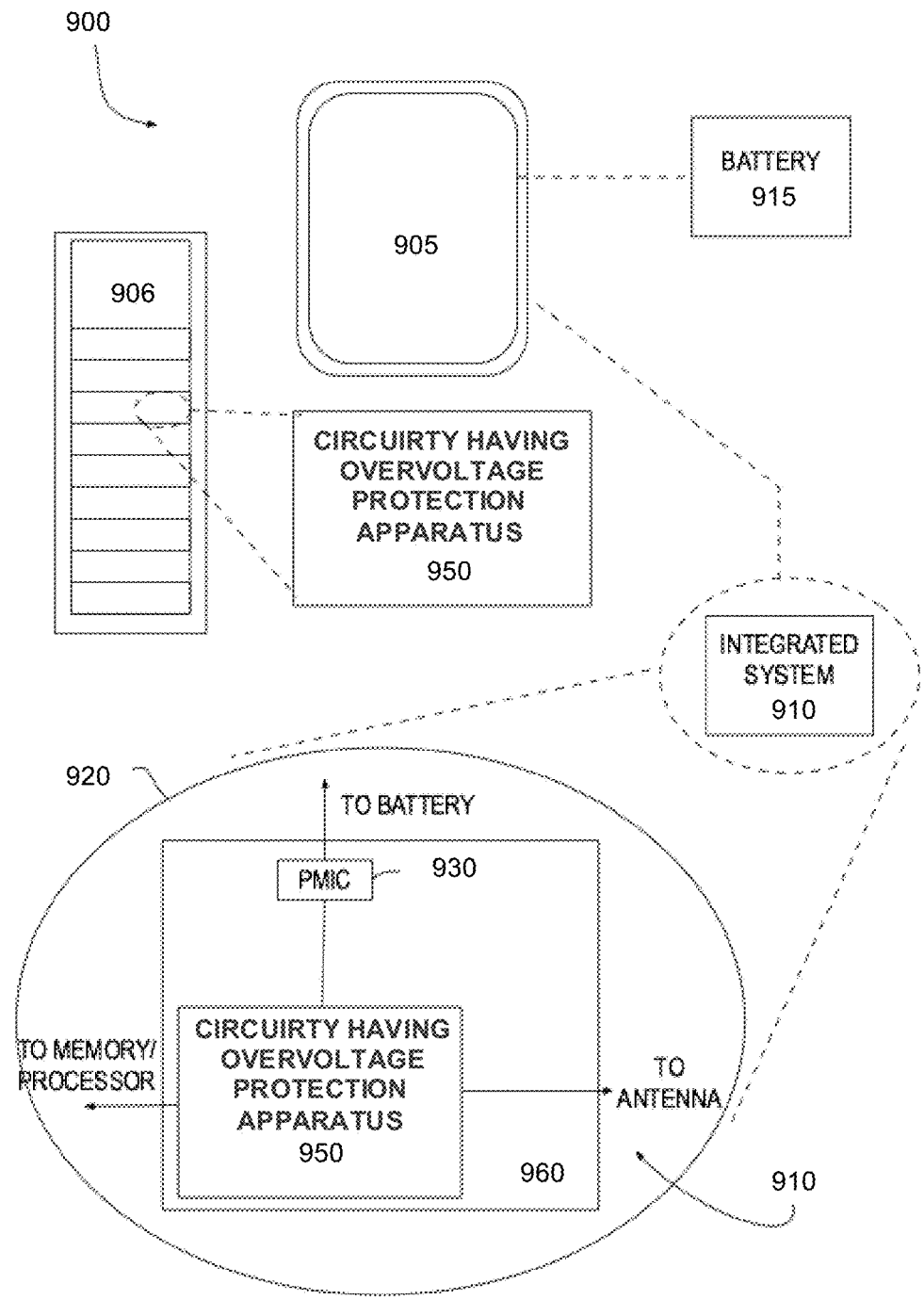
FIG. 9 illustrates a smart device or a computer system or a SoC (System-on-Chip) which includes an apparatus for over-voltage protection according to some embodiments.

FIG. 9 illustrates a system 900 in which a mobile computing platform 905 and/or a data server machine 906 employs circuitry including at least one apparatus for over-voltage protection, for example in accordance with some embodiments described elsewhere herein. The server machine 906 may be any commercial server, for example including any number of high-performance computing platforms disposed within a rack and networked together for electronic data processing, which in the exemplary embodiment includes a circuitry 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone discrete or packaged multi-chip module within the server machine 906, the circuit includes at least one apparatus for over-voltage protection, for example in accordance with some embodiments described elsewhere herein. Circuitry 950 may be further attached to a board, a substrate, or an interposer 960 along with a power management integrated circuit (PMIC). Functionally, PMIC 930 may perform battery power regulation, DC-to-DC conversion, etc., and so has an input coupled to battery 915 and with an output providing a current supply to other functional modules.

Circuitry 950, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one apparatus for over-voltage protection, for example in an over-voltage protection circuit as describe elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided in examples below.

Figure 10:
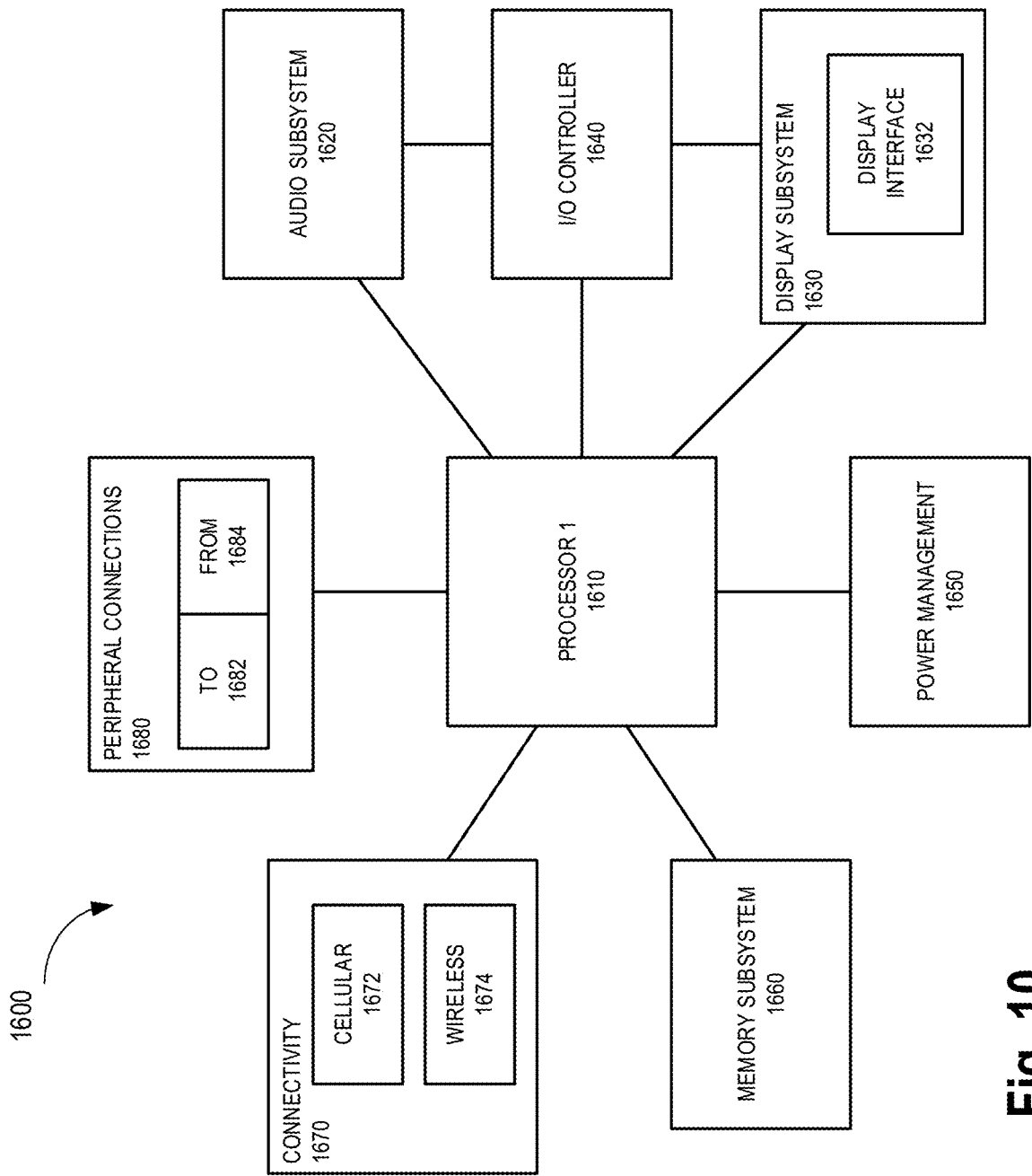
FIG. 10 illustrates a mobile computing platform and a data server machine employing apparatus for over-voltage protection, in accordance with some embodiments.

FIG. 10 illustrates a smart device or a computer system or a SoC (System-on-Chip) with aging tolerant apparatus, according to some embodiments of the disclosure. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with apparatus for over-voltage protection, according to some embodiments discussed. Other blocks of the computing device 1600 may also include device 300, apparatus for over-voltage protection, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display-Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

In one example, an apparatus is provided comprising: An apparatus comprising: a first power supply rail to provide a first power supply; a second power supply rail to provide a second power supply, wherein the first power supply is higher than the second power supply; a first stack of transistors of a same conductivity type, the first stack including a first transistor and a second transistor coupled in series and having a first common node, wherein the first transistor is coupled to the first power supply rail; a second stack of transistors of an opposite conductivity type to the first stack of transistors, the second stack including a third transistor and a fourth transistor coupled in series and having a second common node, wherein the second stack of transistor is coupled in series to the first stack of transistors and having a third common node, wherein a gate terminal of the third transistor is coupled to a circuitry which is coupled to the second power supply rail; and a feedback transistor of a same conductivity type of the third transistor coupled to the second common node and a gate terminal of the third transistor of the second stack.

Example 2

The apparatus of Example 1, wherein the feedback transistor includes a gate terminal which is coupled to the third common node.

Example 3

The apparatus of Example 1-2, wherein the gate terminal of the third transistor, and a gate terminal of the fourth transistor are controllable by two separate control nodes.

Example 4

The apparatus of Example 1-3, wherein the gate terminal of the third transistor is coupled to a second power rail via a pass-gate circuitry.

Example 5

The apparatus of Example 1-4, wherein a gate terminal of a first transistor is coupled to an input voltage, and a gate terminal of the second transistor is couple to a bias voltage.

Example 6

The apparatus of Example 1-5, wherein the feedback transistor is smaller in size than the third transistor.

Example 7

The apparatus of Example 1-6, wherein the feedback transistor is an n-type transistor.

Example 8

The apparatus of Example 1-7 further comprising a capacitor which is coupled with the gate of the third transistor and the gate of the fourth transistor.

Example 9

The apparatus of Example 1-8, wherein a size of the capacitor is proportional to a size of the third transistor.

Example 10

In one example, a system is provided comprising: a memory; a processor coupled to the memory, the processor including: a first power supply rail to provide a first power supply; a second power supply rail to provide a second power supply, wherein the first power supply is higher than the second power supply; a first stack of transistors of a same conductivity type, the first stack including a first transistor and a second transistor coupled in series and having a first common node, wherein the first transistor is coupled to the first power supply rail; a second stack of transistors of an opposite conductivity type to the first stack of transistors, the second stack including a third transistor and a fourth transistor coupled in series and having a second common node, wherein the second stack of transistor is coupled in series to the first stack of transistors and having a third common node, wherein a gate terminal of the third transistor is coupled to a circuitry which is coupled to the second power supply rail; and a feedback transistor of a same conductivity type of the third transistor coupled to the second common node and a gate terminal of the third transistor of the second stack.

Example 11

The system of Example 10, wherein the feedback transistor includes a gate terminal which is coupled to the third common node.

Example 12

The system of Example 10-11, wherein the gate terminal of the third transistor, and a gate terminal of the fourth transistor are controllable by two separate control nodes.

Example 13

The system of claim 10-12, wherein the gate terminal of the third transistor is coupled to a second power rail via a pass-gate circuitry.

Example 14

The system of claim 10-13, wherein a gate terminal of a first transistor is coupled to an input voltage, and a gate terminal of the second transistor is couple to a bias voltage.

Example 15

The system of Example 10-14, wherein the feedback transistor is smaller in size than the third transistor.

Example 16

The system of Example 10-15, wherein the feedback transistor is an n-type transistor.

Example 17

The system of Example 10-16, wherein the processor includes a capacitor, wherein the capacitor is coupled with the gate of the third transistor.

Example 18

The system of Example 10-17, wherein the capacitor size is proportional to the size of the third transistor.

Example 19

In one example, an apparatus is provided comprising: a dual stack high voltage driver, wherein the dual stack voltage driver comprises of a first stack of transistors, and a second stack of transistors, wherein the second stack of transistor is coupled in series to the first stack of transistors; and one or more feedback transistors each coupled to a transistor of the second stack of transistors.

Example 20

The apparatus of Example 19, wherein each second stack transistor and its adjacent second stack transistor are coupled at a first common node, and wherein the feedback transistor coupled to the second stack transistor includes a gate terminal which is coupled to the first common node.

Example 21

The apparatus of Example 19-20, wherein each feedback transistor is coupled to the gate of a second stack transistor, and is coupled to a second common node of the second stack transistor.

Example 22

The apparatus of Example 19-21, wherein each of the gate terminals of the transistors of the second stack of transistors are controlled by a separate control node.

Example 23

The apparatus of Example 19-22, wherein each of the gate terminals of the transistors of the second stack of transistors are coupled to a separate power rail via a pass-gate circuitry.

Example 24

The apparatus of Example 19-23, wherein each feedback transistor of the one or more feedback transistors is smaller in size than the second stack transistor to which it is coupled.

Example 25

The apparatus of Example 19-24, wherein the one or more feedback transistors comprise one or more n-type transistors.

Example 26

The apparatus of Example 19-25, wherein the dual stack high voltage driver includes one or more capacitors, wherein each capacitor of the one or more capacitors is coupled with the gate of a second stack transistor.

Example 27

The apparatus of Example 19-26, wherein the capacitor size is proportional to the size of the second stack transistor to which it is coupled.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. An apparatus comprising:
a first power supply rail to provide a first power supply;
a second power supply rail to provide a second power supply, wherein the first power supply is higher than the second power supply, wherein a voltage level of the first power supply and a voltage level of the second power supply are higher than a ground voltage on a ground power supply rail;
a first stack of transistors of a same conductivity type, the first stack including a first transistor and a second transistor coupled in series and having a first common node, wherein the first transistor is coupled to the first power supply rail;
a second stack of transistors of an opposite conductivity type to the first stack of transistors, the second stack including a third transistor and a fourth transistor coupled in series and having a second common node, wherein the second stack of transistor is coupled in series to the first stack of transistors and having a third common node, wherein a gate terminal of the third transistor is coupled to a circuitry which is coupled to the second power supply rail; and
a feedback transistor of a same conductivity type of the third transistor coupled to the second common node and a gate terminal of the third transistor of the second stack, wherein the feedback transistor includes a gate terminal which is coupled to the third common node.

2. The apparatus of claim 1, wherein the gate terminal of the third transistor, and a gate terminal of the fourth transistor are controllable by two separate control nodes.

3. The apparatus of claim 2, wherein the gate terminal of the third transistor is coupled to a second power rail via the circuitry.

4. The apparatus of claim 1, wherein a gate terminal of the first transistor is coupled to an input voltage, and a gate terminal of the second transistor is couple to a bias voltage.

5. The apparatus of claim 1, wherein the feedback transistor is smaller in size than the third transistor.

6. The apparatus of claim 1, wherein the feedback transistor comprises an n-type transistor.

7. The apparatus of claim 1, further comprising a capacitor which is coupled with the gate of the third transistor and the gate of the fourth transistor.

8. The apparatus of claim 7, wherein a size of the capacitor is proportional to a size of the third transistor.

9. A system comprising:
a memory;
a processor coupled to the memory, the processor including:
a first power supply rail to provide a first power supply;
a second power supply rail to provide a second power supply, wherein the first power supply is higher than the second power supply, wherein a voltage level of the first power supply and a voltage level of the second power supply are higher than a ground voltage on a ground power supply rail;
a first stack of transistors of a same conductivity type, the first stack including a first transistor and a second transistor coupled in series and having a first common node, wherein the first transistor is coupled to the first power supply rail;
a second stack of transistors of an opposite conductivity type to the first stack of transistors, the second stack including a third transistor and a fourth transistor coupled in series and having a second common node, and wherein the second stack of transistor is coupled in series to the first stack of transistors and having a third common node, and wherein a gate terminal of the third transistor is coupled to a circuitry which is coupled to the second power supply rail;

a feedback transistor of a same conductivity type of the third transistor coupled to the second common node and a gate terminal of the third transistor of the second stack;

a capacitor coupled with the gate of the third transistor and the gate of the fourth transistor; and a wireless interface to allow the processor to communicate with another device.

10. The system of claim 9, wherein the feedback transistor includes a gate terminal which is coupled to the third common node.

11. The system of claim 9, wherein the gate terminal of the third transistor, and a gate terminal of the fourth transistor are controllable by two separate control nodes.

12. The system of claim 11, wherein the gate terminal of the third transistor is coupled to a second power rail via a pass-gate circuitry.

13. An apparatus comprising:
a dual stack voltage driver, wherein the dual stack voltage driver comprises a first stack of transistors, and a second stack of transistors, wherein the second stack of transistors is coupled in series to the first stack of transistors; and one or more feedback transistors each coupled to a transistor of the second stack of transistors, wherein each of the gate terminals of the transistors of the second stack transistors are controlled by a separate control node.

14. The apparatus of claim 13, wherein each second stack transistor and its adjacent second stack transistor are coupled at a first common node, and wherein the one or more feedback transistors coupled to the second stack transistor includes a gate terminal which is coupled to the first common node.

15. The apparatus of claim 13, wherein each of the one or more feedback transistors is coupled to the gate of a second stack transistor, and is coupled to a second common node of the second stack transistor.

16. The apparatus of claim 13, wherein each of the gate terminals of the transistors of the second stack of transistors are coupled to a separate power rail via a pass-gate circuitry.

17. The apparatus of claim 16, wherein each feedback transistor of the one or more feedback transistors is smaller in size than the second stack transistor to which it is coupled.

18. The apparatus of claim 16, wherein the one or more feedback transistors comprise one or more n-type transistors.

19. The apparatus of claim 16, wherein the dual stack voltage driver includes one or more capacitors, wherein each capacitor of the one or more capacitors is coupled with the gate of a second stack transistor, and wherein the capacitor size is proportional to the size of the second stack transistor to which it is coupled.

20. An apparatus comprising:
a dual stack voltage driver, wherein the dual stack voltage driver comprises a first stack of transistors, and a second stack of transistors, wherein the second stack of transistors is coupled in series to the first stack of transistors; and one or more feedback transistors each coupled to a transistor of the second stack of transistors, wherein each second stack transistor and its adjacent second stack transistor are coupled at a first common node, and wherein the one or more feedback transistors coupled to the second stack transistor includes a gate terminal which is coupled to the first common node.

21. The apparatus of claim 20, wherein each of the gate terminals of the transistors of the second stack transistors are controlled by a separate control node.

* * * * *